Dec. 16, 1969 J. E. KAUFFMAN 3,484,533

METHOD FOR FABRICATING SEMICONDUCTOR PACKAGE AND RESULTING ARTICLE OF MANUFACTURE

Filed Sept. 29, 1966 4 Sheets-Sheet 1

INVENTOR
JOHN E. KAUFFMAN

E. Mickey Hubbard
ATTORNEY

INVENTOR
JOHN E. KAUFFMAN
E. Mickey Hubbard
ATTORNEY

INVENTOR
JOHN E. KAUFFMAN
E. Mickey Hubbard
ATTORNEY

METHOD FOR FABRICATING SEMICONDUCTOR PACKAGE AND RESULTING ARTICLE OF MANUFACTURE

Filed Sept. 29, 1966 4 Sheets-Sheet 4

INVENTOR
JOHN E. KAUFFMAN
E. Mickey Hubbard
ATTORNEY

United States Patent Office 3,484,533
Patented Dec. 16, 1969

3,484,533

METHOD FOR FABRICATING SEMICONDUCTOR PACKAGE AND RESULTING ARTICLE OF MANUFACTURE

John E. Kauffman, Richardson, Tex., assignor to Texas Instruments Incorporated, Dallas, Tex., a corporation of Delaware Filed Sept. 29, 1966, Ser. No. 584,053
Int. Cl. H05k 5/06
U.S. Cl. 174—52 21 Claims

ABSTRACT OF THE DISCLOSURE

Disclosed are improved methods for fabricating a hermetically sealed package for integrated circuits or other type electrical components and the resulting article of manufacture. Several embodiments disclosed relate to hermetically sealed packages of the type having at least one lead wire extending through but insulated from the conductive container or header of the package.

This invention relates generally to semiconductor devices, and more particularly relates to an improved method for fabricating a multilead hermetically sealed semiconductor package, to various articles of manufacture used in the process, and to the resulting package.

It is vitally important that all semiconductor devices be placed in a controlled atmosphere. Otherwise the devices are unstable and their useful life unpredictable, and usually very short. One method of packaging semiconductor devices that is prevalent in the industry entails placing the semiconductor device in a metal container through which electrical leads extend. A glass seal is provided between each of the leads to hermetically seal the package, to electrically insulate the leads from the package, and usually to mechanically anchor and support the leads.

The packaging of integrated circuit networks having a number of active semiconductor components formed in situ on a single semiconductor substrate is particularly difficult due to the large number of electrical leads which must extend from the semiconductor chip through the package for connection to an external circuit. It is believed that the best previous method for packaging integrated circuits is described in copending U.S. application Ser. No. 518,214, entitled "Process for Fabricating Hermetic Seals," filed on Jan. 3, 1966 by Rogers et al. and assigned to the assignee of the present invention, now abandoned. Although the invention claimed in that application extends to the formation of hermetic seals generally, the illustrative embodiment of the invention described in detail involves the fabrication of an industry standard "flat-pack" for an integrated circuit. Such a flat-pack is typically on the order of 0.25 inch long, 0.125 inch wide and 0.03 inch deep, and typically has fourteen leads. In the fabrication of such a flat-pack, a so-called lead frame is formed by stamping, or by photoetching techniques, from a sheet of metal. The lead frame has a rectangular frame with integral leads extending inwardly from opposite sides of the frame. A header body is formed by welding a base plate over the bottom of a ring frame having slots in the side walls for receiving the leads while the leads are positioned in the slots of the ring frame. As a result, each of the leads extends through its own individual opening in the side wall of the resulting header body. Then the header body is filled with a slurry of finely ground glass carried by an evaporable liquid, such as water, while holding the lead frame in precise predetermined relation to the header body so that each of the leads extends through the center of the respective opening without touching the header body.

The complexity of the problem of inserting the glass slurry while holding the leads in precisely the proper relationship with respect to the header body is evident from copending U.S. application Ser. No. 527,838, entitled "Liquid Insertion Method and Machine," filed on Feb. 16, 1966 by Ralph S. Litterst and assigned to the assignee of the present invention, now U.S. Patent No. 3,389,723, issued June 25, 1968. In that application, considerable precision jigging is described for supporting the lead frame in the precise relationship with respect to the header during the insertion of the glass slurry and during the subsequent drying of the slurry in a relatively low temperature oven. As the slurry is dried, the glass particles are packed into the openings between the lead wires and the header body by the surface tension of the remaining liquid and forms a hard body of particulate glass having sufficient integrity to permit transfer of the assembly onto precision graphite boats. The graphite boats must also hold the lead frames in the precise relationship with respect to the header because the assemblies are then passed through a fusing furnace and the body of particulate glass melted and fused into a solid glass seal. The excess glass is then sandblasted away to expose the ends of the leads within the package and to expose the top surface of the base plate. The resulting structure is then usually referred to as a header.

It is desirable and customary to then electroplate the header assembly with a suitable metal, such as gold, to stabilize the surface and facilitate subsequent bonding operations. The lead frame must be electrically shorted to the header body in order to plate the entire exposed metal surfaces of the assembly uniformly with gold. This is typically accomplished by threading a stiff wire over one side of the lead frame, under the header body, and over the opposite side of the lead frame.

The integrated circuit wafer is then mounted on the exposed surface of the base plate using an insulating glass adhesive and the ends of the leads electrically connected to expanded contact pads on the wafer by bonded jumper wires. A flat top plate is then stitch welded around the top rim of the ring frame forming the header body to complete the hermetically sealed package. The final package is then tested for leaks by subjecting the package to helium under high pressure, then placing the package in a vacuum. Any helium which may have entered the package under pressure will then escape into the evacuated chamber and can be detected to indicate a leaking package.

Although the flat-pack is generally considered as the best available packaging technique for integrated circuits, and as such has been widely used throughout the industry for a number of years, there are a number of problems associated with the manufacture of these devices which the present invention alleviates. For example, the welding of the base plate to the ring frame to form the header body requires relatively expensive equipment and the time of skilled personnel. This step is materially complicated by the fact that the lead frame must be present during the welding process. The lead frame is very delicate and is relatively easily damaged, and its presence during the welding process contributes to production losses and lower yields. The precision equipment required to precisely orient the lead frame relative to the header body assembly while the glass slurry is inserted and dried, and the precision graphite boats required for the same purpose during fusing of the glass, requires considerable initial capital expenditures. Further, the boats must be replaced on a fairly regular basis as the precision parts are worn in order to prevent yield percentages from dropping significantly. As mentioned.

the lead frame must be electrically shorted to the header body in order to obtain uniform electroplating. This requires capital expenditures for equipment and continuing cost for labor and the shorting clips.

Another type of package which is gaining some acceptance in the industry utilizes a ceramic header. A plurality of lead pins are secured in the header and extend from a printed circuit formed on the upper surface of the header through the ceramic material and project from the lower surface of the header. The integrated circuit chip is then mounted on the upper surface of the header and expanded contact pads electrically connected to the integrated circuit formed on the surface of the header by jumper wires. The semiconductor chip is then hermetically sealed by a metallic can or lid which is bonded to the ceramic header by brazing, soldering or glassing. This device has a relatively high process cost due to the relatively large number of the steps which must be performed including firing, metallizing, refiring, plating, brazing, grinding, etc. Further, the package cannot be sealed using conventional welding techniques, but must be sealed using brazing soldering or some other more expensive or specialized technique.

An important object of this invention is to provide an improved and less expensive hermetically sealed package for integrated circuit or other similar semiconductor devices.

Another object is to provide an improved process which substantially eliminates all of the objections referred to above in connection with the fabrication of hermetically sealed packages presently used by the industry, and more specifically one which completely eliminates the welding step in the fabrication of the header assembly, eliminates the precision jigging required during the insertion and drying of the glass slurry and the subsequent fusing of the dried glass slurry, and eliminates shorting the lead frame to the header body prior to electroplating.

Another object is to provide an improved header for an integrated circuit package which can be sealed by a customer using conventional welding techniques.

A further object of the invention is to provide a header wherein a plurality of leads extend from a single opening in the header body so that the leads may be wider and therefore stronger without sacrificing electrical isolation, or may be spaced further apart to improve electrical isolation, or may be provided with more leads without sacrificing either isolation or strength.

Still another object of this invention is to provide a header having a plurality of separate hermetically sealed compartments but a common heat sink so that two or more devices may be placed in individual environments.

Another important object of the invention is to provide a hermetically sealed package having improved thermal dissipation qualities and greater structural integrity so as to decrease breakage during handling and subsequent connection of the device into a circuit and also increase the pressure to which the device can be subjected during the helium leak test procedure.

These and other other objects are accomplished in accordance with this invention by utilizing a header body formed as a continuous loop, with open opposite ends and an aperture in one side wall. Two sets of leads extending inwardly from opposite sides of the lead frame are inserted in the opposite open ends of the header body. The header body is then loaded with glass and the glass fused while the header body is held in predetermined relationship to the lead frame to form a seal between the leads and the header body which also electrically insulates the leads one from the other and from the header body and mechanically anchors the leads.

In accordance with another important aspect of the invention, a header body is held in position relative to the leads during the formation of the glass seal by the lead frame. This eliminates the need for any boats and also eliminates the need to short the header body to the lead frame during subsequent electroplating.

The continuous loop header body can be fabricated without welding by forming a tube of the desired cross section by any suitable technique, such as extrusion, then cutting the tube into short lengths and punching an aperture in one wall. This not only eliminates any welding step, but also results in a stronger header body having improved thermal dissipation characteristics. The header assembly may then be sealed merely by welding a lid over the aperture formed in one side wall of the header body after the semiconductor device has been inserted through the aperture and bonded to the inside surface of the opposite side wall and the jumper wires connected between the ends of the leads and the semiconductor device.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
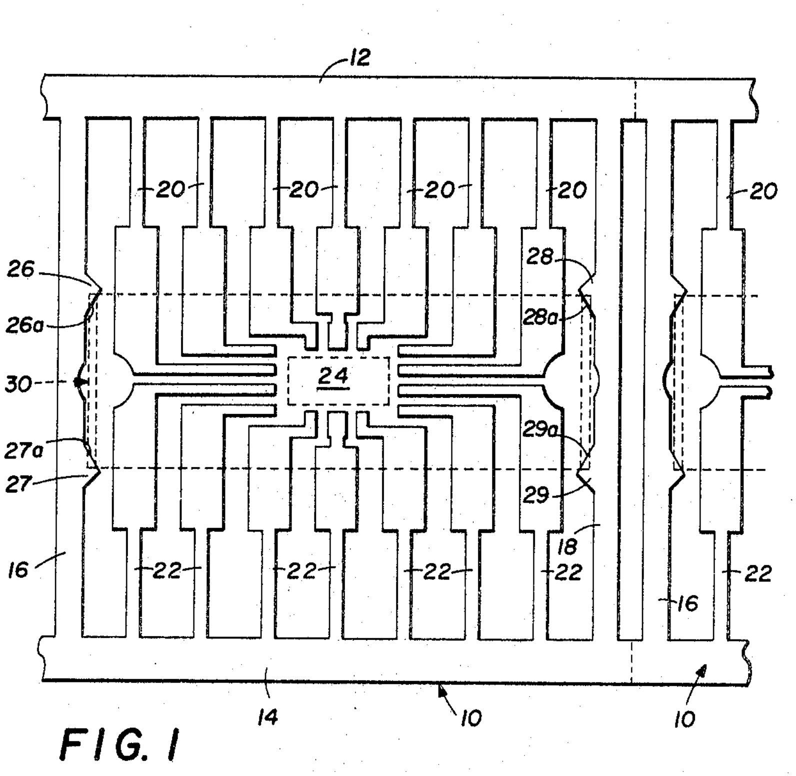
FIGURE 1 is a plan view of a lead frame constructed in accordance with the present invention.

Referring now to the drawings, a typical lead frame constructed in accordance with the present invention is indicated generally by the reference numeral 10. The lead frame 10 may be stamped or formed by conventional photoetching techniques from a substantially continuous strip of a suitable sheet metal, or by any other suitable process. A suitable and often used metal is the alloy known by the trade name "Kovar" which is typically comprised of about 54% iron, 28% nickel, 18% cobalt, or 20% nickel, 17% cobalt, 0.2% manganese, and the remainder iron. This alloy is wet by molten glass and has substantially the same temperature expansion coefficient as certain hard glasses frequently used to make a seal, and therefore is particularly useful in making glass-to-metal seals. Of course, any other suitable metal can be used if desired. Each lead frame of the strip is comprised of a generally rectangular frame formed by opposite side members 12 and 14 which extend longitudinally of the lead frame strip, and opposite side members 16 and 18 which extend transversely of the lead frame strip. A first set of leads 20 are formed integral with the side member 12 and extend inwardly toward the middle of the frame. A duplicate set of leads 22 are integral with and extend inwardly from the opposite side member 14. The ends of all of the leads 20 and 22 terminate around an open space of sufficient size to receive an integrated circuit chip 24 indicated by the dotted outline. In accordance with one important aspect of the invention, a means is provided on the two opposed transverse members 16 and 18 for holding the header body 30, illustrated in dotted outline, which will presently be described in detail and is illustrated in detail in FIGURES 2–4 in the proper position relative to the leads 20 and 22 during the formation of the hermetic glass seal between the leads and the header body. In a preferred embodiment, this comprises a pair of projections 26 and 27 on the side member 16, and projections 28 and 29 on the opposing side member 18. The projections 26–29 have generally straight edges **26*a*–29*a*, respectively, which are disposed at an acute angle to the side of the header body and are received in grooves at the four corners of the header body 30 as indicated in dotted outline. As will hereafter become more evident, these projections orient the body 30** in all three coordinate directions so as to properly position the header body relative to the leads.

Figure 3:
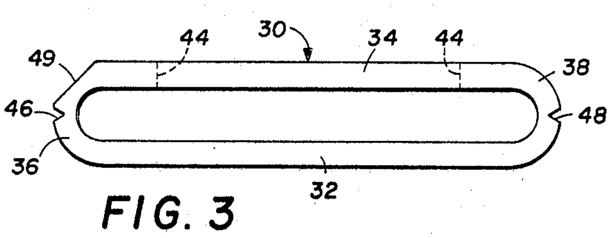
FIGURE 3 is a side view of the header body illustrated in FIGURE 2.
Figure 4:
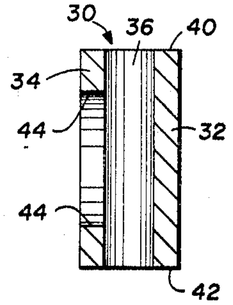
FIGURE 4 is a sectional view taken substantially on lines 4—4 of FIGURE 2.
Figure 2:
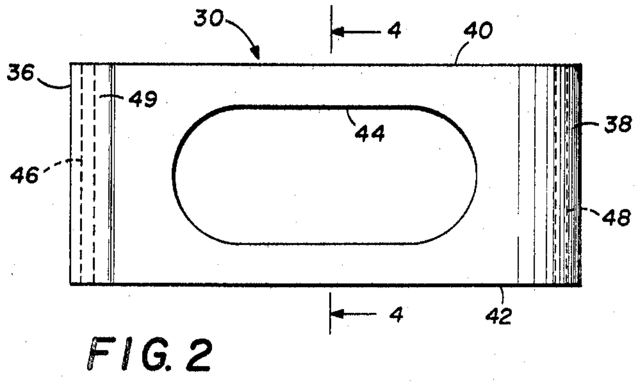
FIGURE 2 is a plan view of a header body constructed in accordance with the present invention.

Referring now to FIGURES 2, 3 and 4, the header body 30 is a continuous loop formed by a single tubular piece of metal, typically Kovar. The cross-sectional configuration of the body is generally oval shaped and has a generally planar bottom wall 32, a generally planar upper wall 34 parallel to the bottom wall, and semicircular side walls 36 and 38. The opposite ends 40 and 42 of the tubular body are open, as best seen in FIGURES 3 and 4. An oval shaped aperture 44 is formed in the top wall 34. A pair of grooves 46 and 48 are formed in the outer surfaces of side walls 36 and 38 to form the notches at the four corners of the header body for receiving the orienting edges **26*a*–29*a* of the lead frame 10. A flat surface 49 provides a means for both mechanical and visual orientation of the device so that the leads 20 can be distinguished from the leads 22** after the device is completed.

In accordance with the broader aspects of the invention, the header body 30 can be fabricated using any suitable conventional process, such as molding, and may be fabricated from any suitable material. However, in accordance with one more specific aspect of the invention, the header body 30 is preferably formed by extruding a length of tubing having the desired cross section configuration illustrated in FIGURE 3 with the grooves 46 and 48 and the flat orientation surface 49 as desired. This is preferably achieved using a process which eliminates any significant discontinuities around the periphrey of the tube which would tend to weaken the structure or constitute an impedance to transfer of thermal energy around the periphery of the device. Then the tubular stock is cut to the desired length and the opening 44 punched in the top wall using conventional techniques. It is to be understood that the sequence of the latter two steps is purely a matter of choice.

Figures 5, 6, 7, 8, 9, 10, 11:
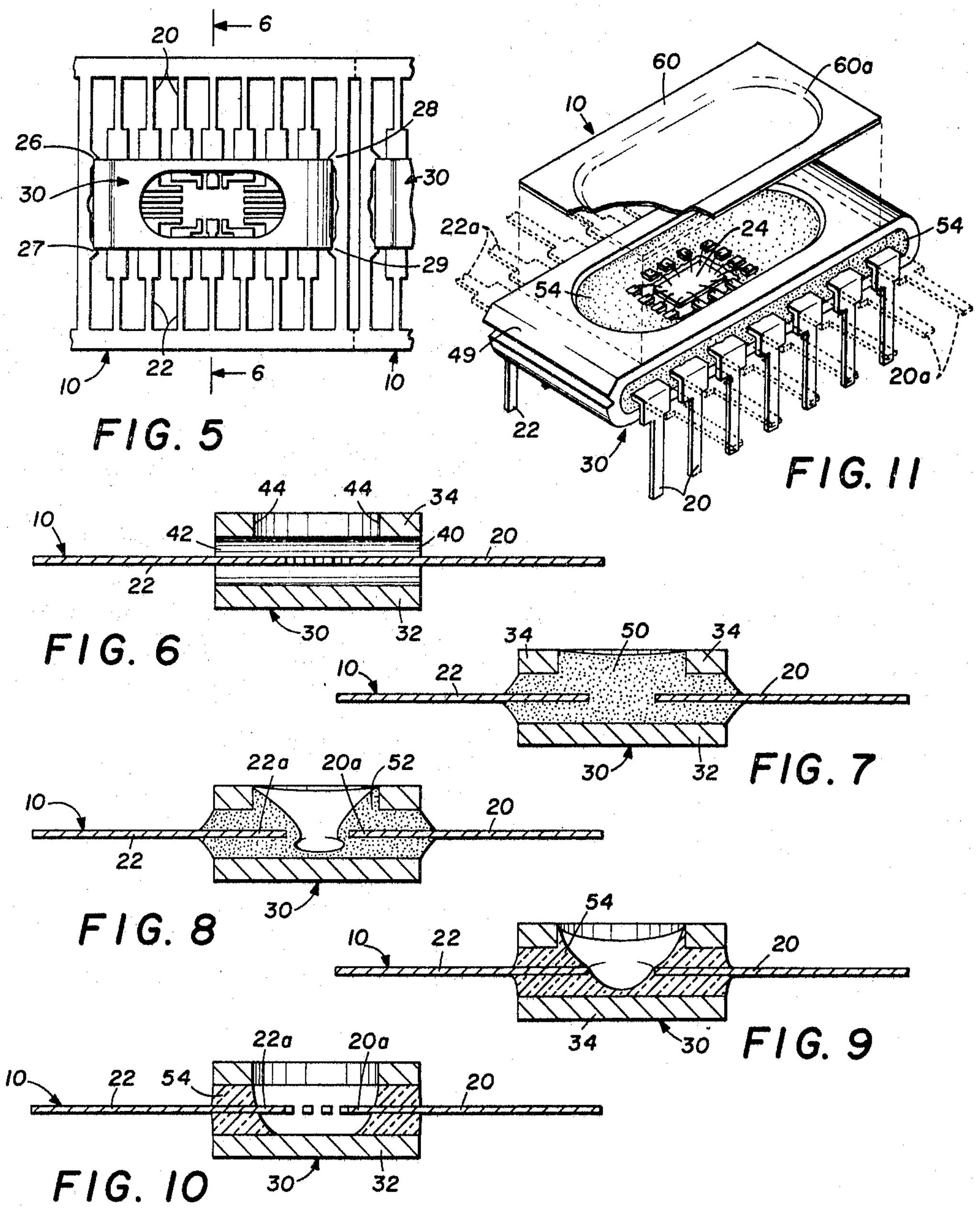
FIGURE 5 is a plan view showing the header body of FIGURE 2 in position with respect to the lead frame of FIGURE 1 prior to the application of a glass slurry.
FIGURE 6 is a sectional view taken substantially on lines 6—6 of FIGURE 5.
FIGURES 7, 8, 9 and 10 are sectional views similar to FIGURE 6 showing various stages in the process for forming a hermetic glass seal between the lead frame and header body.
FIGURE 11 is a perspective view of the completed header assembly together with the lid which is welded to the header to produce a hermetically sealed package.

After the lead from 10 and header body 30 have been fabricated, the header body 30 is inserted in the lead frame 10 in the position illustrated in FIGURES 5 and 6. This is achieved by springing the set of leads 20 above the plane of the lead frame so that the header body can be slipped entirely over the leads and over the two orienting projections. For example, the body may be moved around leads 20 by deflecting the leads 20 upwardly so that the body will clear projections 26 and 28. When the opposite edge of the body clears the ends of the other set of leads 22, the other leads 22 are deflected upwardly so that they are inserted into the opposite open side of the body while moving the body back to the center position. Then the body can be forced downwardly between the projections 26–29 so that the projections snap into the grooves 46 and 48 at the corners of the header body 30. Or, the header body 30 may be slipped over one set of leads past the ends of the other set of leads, then moved back over the other set of leads by springing the side portions 16 and 18 outwardly until the projections snap into the grooves at the corners of the header body. The ends of the leads 20 and 22 then extend through the opposite open sides 40 and 42 of the body 30 as best seen in FIGURE 3. It is important to note that the body 30 is then oriented in all three coordinate directions relative to the lead frame 10 merely by the presence of the projections 26–29 in the grooves 46 and 48 at the corners of the header body 30. This eliminates the need for any jigging or boats to hold the header body 30 in the proper position relative to the lead frame during the subsequent formation of the glass seal as will now be described.

Next, a hermetic glass seal is made between the leads 20 and 22 and the header body using the process described in the above-referenced copending application, Ser. No. 518,214. This is achieved by filling the assembly of FIGURE 6 with a liquid slurry 50 substantially as illustrated in FIGURE 7. It will be noted that the slurry 50 passes into the openings formed between the walls 32, 34, 36 and 38 and envelops each of the leads 20 and 22. The slurry 50 may be a suspension of finely ground glass particles in water, or other evaporable liquid. A typical slurry may be about 10 parts glass to 6 parts distilled water. No other additive, binder, or suspension agent is required. The glass may typically be Corning glass No. 7052, a borosilicate glass, which has been wet ball milled for ten hours until about 50% of the particles range in size from four to ten microns, as determined by a Mine Safety Appliance Company centrifugal type particle size analyzer, with a somewhat even distribution within this range. Some data indicates that if more than about 50% of the particles are greater than ten microns, the final glass product tends to contain bubbles which are undesirable. Also if the particle sizes are too large, the glass particles tend to settle out like sand and are not carried by the water and distributed as desired. There does not appear to be a minimum limit on the size of the particles. The viscosity of the slurry successfully used has ranged from about 10–13 centipoises as measured by a Brookfield viscometer using spindle #10, and the surface energy from about 65–75 dynes/cm. as measured by a Fisher surface tensiomat. It is to be understood, however, that this invention is not limited to any particular type of glass, to any particular particle size, or to any particular ratio of liquid and glass particles. In order to achieve the desired results, however, there must be an adequate volume of glass particles within the liquid to fill the spaces to be sealed after the liquid is evaporated, and the glass particles must be sufficiently small to be carried into the cracks, crevices and openings by the surface tension of the slurry. The viscosity and surface tension of the slurry must be chosen so as to penetrate the openings to be sealed, yet remain in the openings once the openings are filled.

After the assembly is filled with the slurry 50 as illustrated in FIGURE 7, it is typically transferred to a conveyor which passes through an oven operating at about 70°–80° C. to evaporate the water from the slurry. As the water evaporates, the glass particles coagulate into a particulate mass 52 having a cross section substantially as illustrated in FIGURE 8. It will be noted that the particulate mass 52 is disposed in the openings around the leads 20 and 22 and also covers the ends **20*a* and 22*a* of the leads. The particulate mass 52 has sufficient integrity to withstand ordinary handling without crumbling. The assembly is then passed through a fusing furnace typically operated at about 925° C. for a period of about 1.5 hours. As a result, the glass particles are fused together to form a solid glass seal 54 having a cross section substantially as illustrated in FIGURE 9. Again it will be noted that the solid glass seal 54 completely fills the spaces between the leads and the header body, and also continues to cover the ends 20*a* and 22*a* of the leads, as well as the lower wall 34. It is very important to note that during the placement of the slurry 50, the drying of the slurry to produce the particulate mass 52, and the subsequent fusing of the particulate mass to produce the solid glass seal 54, the header body 30 is held in the proper position relative to the lead frame by the projections 26–29 and grooves 46 and 48. No special precision supporting jigs or boats are required during any of this processing in order to maintain this relationship which is so important. Next, the excess glass 54 is removed from the interior of the header device so as to expose the ends 20*a* and 22*a* of the leads and the interior surface of the lower wall 32**.

Figure 12:
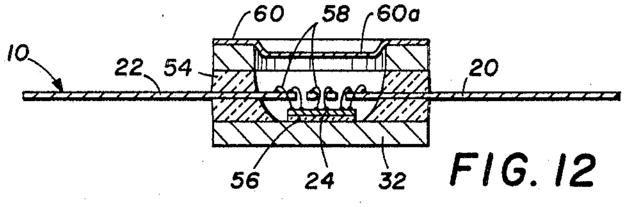
FIGURE 12 is a sectional view similar to FIGURES 6–10 showing a completely packaged semiconductor device.

The exposed surfaces of the device can then be very easily electroplated with gold or other metal, as desired, because the lead frame 10 is already electrically connected to the header body 30 by the orienting projections 26–29 so that a uniform plating can be achieved. The header is then complete and is typically sold in this condition to semiconductor manufacturers prior to the removal of the lead frame from the leads. The semiconductor device 24 can then be inserted through the aperture 44 and bonded to the inner face of the lower wall 32 by an insulating material 56. Very small diameter gold jumper wires 58 are then bonded to the ends of the leads 20 and 22 and to expanded contact pads on the surface of the semiconductor device 24 to electrically connect the respective leads to the device. A metal lid, usually Kovar, is then placed over the aperture 44 and stitch welded to the upper surface of the upper wall 34 around the periphery of aperture 44 to hermetically seal the package. The lid 60 is preferably formed with a recessed portion **60*a* illustrated in FIGURES 11 and 12 which is sized and shaped to be closely received in the aperture 44 and thus orient the lid in proper position over the opening to facilitate the welding process. The depression 60*a* also materially stiffens and strengthens the lid for handling prior to welding to insure a flat device and a good fit, and reduces stresses on the weld during subsequent helium tests. At any time after the lead is complete, the lead frame side members 12, 14, 16 and 18 can be trimmed away. The leads 20 and 22 may be left in the planar positions 20*a* and 22*a*** shown in dotted outline in FIGURE 11 to be soldered on a printed circuit board, or bent downwardly as shown in solid outline so as to be inserted in a multilead socket.

From the above detailed description it will be noted that an improved package has been disclosed which can be fabricated using a very economical process. The header body is an integral member having no welded joints which would disrupt the flow of thermal energy. Therefore, a greater mass of metal having a greater exposed surface area is efficiently coupled to the semiconductor device. The arcuate, semicircular, or rounded side walls 36 and 38, which are continuations of the top and bottom walls and therefore result in no reduction in thickness of the walls, promote the transfer of thermal energy and also increase the mechanical strength of the body generally, and particularly against external fluid pressure. Since there are no portions of the header body between the leads, the leads may be made wider for added strength, or made narrower to either increase the number of leads or increase the breakdown voltage between leads.

The header body 30 described in FIGURES 2–12 was formed by a cold drawing process which results in a substantially seamless tubular or continuous loop body. However, in accordance with another aspect of the invention, the continuous loop header bodies may be formed by folding a sheet 64 of suitable metal into the desired cross-sectional configuration, such as that shown in FIGURE 13 and then welding the abutting edges to form a tubular member having a longitudinally extending seam 66. The tubular member can then be separated along the dotted lines 68 and apertures, represented by the dotted outlines 69, punched in the top wall to complete each header body.

Figure 14:
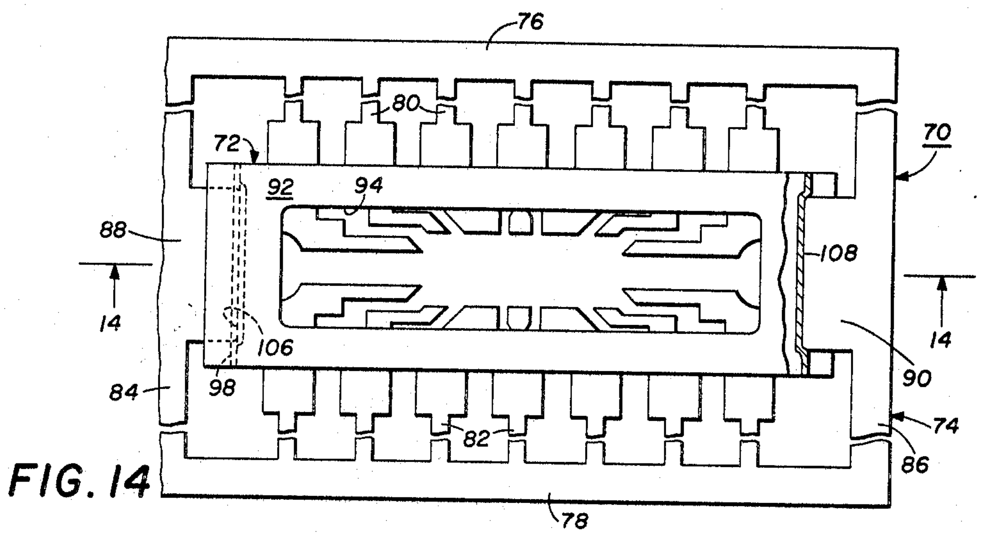
FIGURE 14 is a plan view, partially broken away to show details of construction, of another header assembly constructed in accordance with the present invention.
Figure 15:
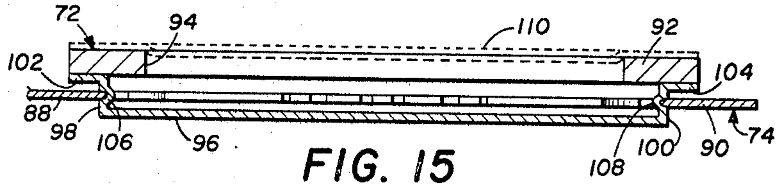
FIGURE 15 is a sectional view taken substantially on lines 15—15 of FIGURE 14.
Figures 13, 16:
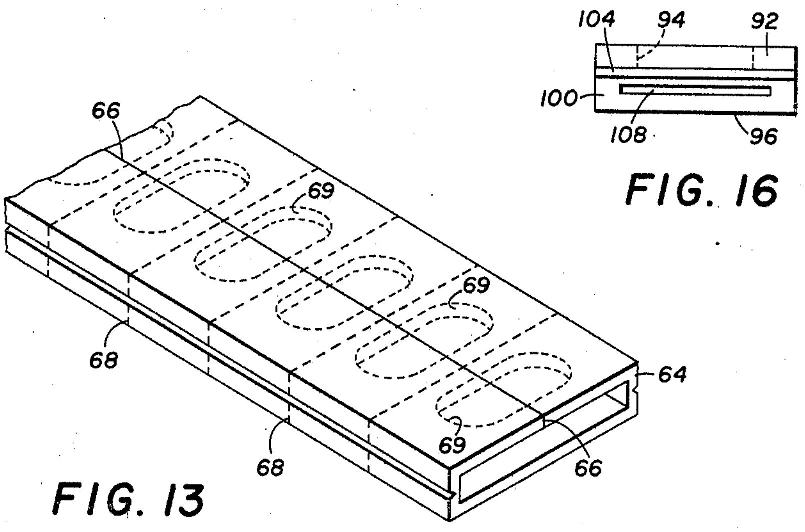
FIGURE 13 is a simplified perspective view illustrating an alternative process for fabricating a header body in accordance with the present invention.
FIGURE 16 is an end view of the header body of the assembly shown in FIGURE 14.

Referring now to FIGURES 14, 15 and 16, another header assembly constructed in accordance with the present invention is indicated generally by the reference numeral 70. The header assembly 70 is comprised of a header body 72 and a lead frame 74. The lead frame 74 may be substantially identical to lead frame 10 and includes opposite side members 76 and 78, from which sets of leads 80 and 82 extend inwardly, which are interconnected by side members 84 and 86. However, instead of the projections 26–29, the lead frame 70 is provided with tabs 88 and 90 which extend inwardly from the opposite sides 84 and 86 of the lead frame.

The principal difference between the header assembly 70 and the header assembly shown in FIGURE 5 is the header body 72 which is comprised of a ring member 92 fabricated from relatively thick material, as best seen in the sectional view of FIGURE 15. The ring member 92 has an aperture 94 therethrough corresponding to aperture 44 of the header body 30. A relatively thin walled base member 96 has opposite side walls 98 and 100 which are welded to the underside of the ring member 92 by flanges 102 and 104 using conventional techniques. The opposite end walls of the base member 96 are open to permit the sets of leads 80 and 82 to enter the continuous loop header body 72 as heretofore described. A pair of coined grooves 106 and 108 are formed in the outer surfaces of the side walls 98 and 100 and are sized to receive the ends of the tabs 88 and 90, respectively, which extend from the opposite sides 84 and 86 of the lead frame 74 to precisely orient the header body 72 with respect to the leads 80 and 82 in the three coordinate directions as heretofore described. The header assembly can then be completed using the steps illustrated in FIGURES 6–10 to hermetically seal the spaces between the leads 80 and 82 and the header body 72 and simultaneously anchor the leads in the header body. The package can then be sealed by welding a lid 110 over the aperture 94 after the semiconductor has been bonded to the plate 96 and connected to the ends of the leads 80 and 82 as heretofore described.

Although the header body 72 does not have all of the structural and thermal advantages of the header body 30, it nevertheless can be fabricated very economically. This may be achieved by the steps of stamping the ring 92 and the bottom plate 96, and then welding the two parts together using a single shot weld press on the flanges 102 and 104. Or an elongated tube may be fabricated by stamping an elongated base strip and ring member strip and welding the two parts together, then separating the tubular member into the individual header bodies. The apertures may be cut either before or after the tube is separated into the individual bodies.

Figure 17:
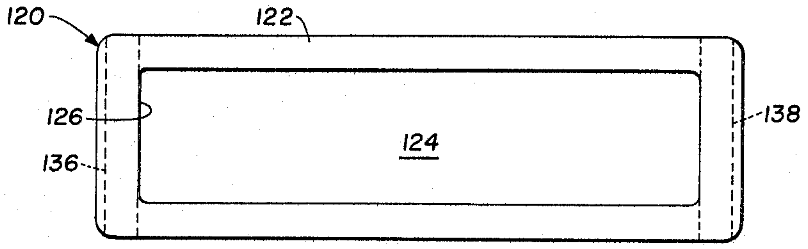
FIGURE 17 is a partial plan view of still another header body constructed in accordance with the present invention.
Figure 18:
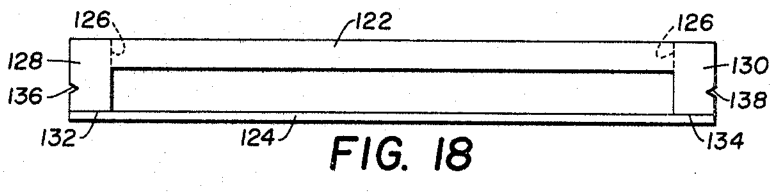
FIGURE 18 is a sectional view taken substantially on lines 18—18 of FIGURE 17.

Referring now to FIGURES 17 and 18, another header body constructed in accordance with the present invention is indicated generally by the reference numeral 120. The header body 120 is also a continuous loop fabricated by welding a ring member 122 and a base member 124 together. The ring member 122 has an aperture 126 extending therethrough which corresponds roughly to the aperture 44 in the header body 30. The ring member 122 also includes a pair of side walls 128 and 130 which are sufficiently thick that the relatively thin walled base member 124 can be welded directly to the bottom edges of the side walls along seams 132 and 134. Orienting grooves 136 and 138 similar to grooves 46 and 48 are provided in the side walls 128 and 130 to receive orienting projections on the lead frame, such as projections 26–29 on the lead frame 10. The opposite ends of the header body are open as illustrated in FIGURE 18 to reecive the sets of leads extending from opposite sides of the lead frame.

Figure 19:
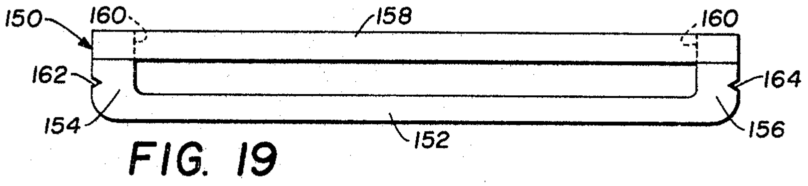
FIGURE 19 is a sectional view similar to FIGURE 18 of still another header body constructed in accordance with the present invention which may have a plan view corresponding substantially to FIGURE 17.

Referring now to FIGURE 19, still another header body constructed in accordance with the present invention is indicated generally by the reference numeral 150. The header body 150 is quite similar to the header body 120 except that the base member 152 is relatively thick and the side walls 154 and 156 are intergral with the base member, rather than the ring member. The side walls 154 and 156 are sufficiently thick that the ring member 158 can be butt welded to the edges of the side walls. The ring member 158 has an aperture 160, represented by dotted line, extending therethrough and may have a plan view substantially identical to the header 120 as shown in FIGURE 17. A pair of grooves 162 and 164 are provided in the outer surfaces of the side walls 154 and 156 to cooperatively engage projections on the lead frame as heretofore described for precisely positioning the header body relative to the leads extending into the header body from the lead frame during the formation of the glass seal between the header body and the lead frame.

Figure 20:
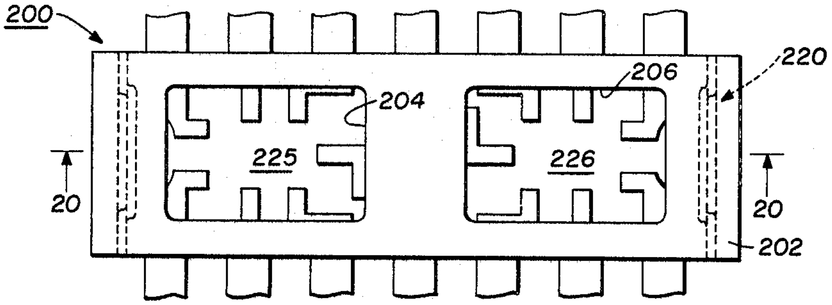
FIGURE 20 is a plan view of a multiple cavity header constructed in accordance with the present invention.
Figure 21:
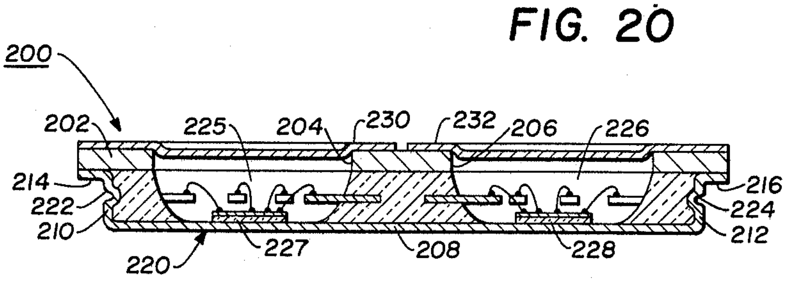
FIGURE 21 is a sectional view taken substantially on lines 21—21 of FIGURE 20.

Referring now to FIGURES 20 and 21, another header constructed in accordance with the present invention is indicated generally by the reference numeral 200. The header body 220 of header 200 may be constructed in the same manner as any header body heretofore described, but has a plurality of apertures in the top wall, rather than one. As illustrated, the header 200 is comprised of a ring member 202 having a pair of apertures 204 and 206. A bottom plate 208, which is substantially identical to the bottom plate 96 described in FIGURES 14–16, has a pair of side walls 210 and 212 which terminate in flanges 214 and 216, respectively, which are welded to the underside of the ring member 202 to form the continuous loop header body 220. The header body 220 is thus substantially identical to the header body 72, except that two apertures 204 and 206 are provided in the top wall, rather than one. Coined grooves 222 and 224 may be provided in the side walls 210 and 212 to align the header body with the leads during fabrication as heretofore described. Any desired number of leads may extend from the opposite sides of the lead frame (not illustrated) and terminate around the two apertures 204 and 206 in any desired pattern, such as that shown in FIGURE 20. A glass seal is then formed between the header body and leads using the process described in connection with FIGURES 6–10. This results in two separate cavities 225 and 226. Individual semiconductor devices 227 and 228 may then be placed in the cavities 225 and 226, respectively. The cavities may then be sealed using a common lid, but preferably are sealed using individual lids 230 and 232 as shown in FIGURE 21, so that the ambient in each of the cavities may be separately controlled.

It will be noted that the two semiconductor devices 227 and 228 are thus mounted on a common heat sink, but are disposed wtihin separate hermetically sealed compartments so that different ambients may be provided as desired. Of course, it will be appreciated that the continuous loop header body 220 may be fabricated using any of the processes heretofore described. Also, more than two cavities may be formed if desired, and the cavities may open to opposite sides of the header body if desired.

Although preferred embodiments of the invention have been described in detail, it is to be understood that various changes, substitutions and alterations can be made therein without departing from the spirit and scope of the invention.

What is claimed is:

1. A package for hermetically sealing an electrical device of the type having at least one lead wire extending from the package, comprising:

(a) a header body having top and bottom walls, a pair of sidewalls and at least a pair of end walls, with said top wall having at least one aperture formed therein and at least one end wall being at least partially open; and (b) a lead frame having at least one lead extending toward said body and into said open end wall; and wherein (c) said header body and lead frame have co-operating means formed thereon for positioning said body in a predetermined relationship with respect to said lead frame.

2. The package of claim 1 wherein:

(a) each of said end walls are at least partially open; and wherein (b) said lead frame has at least two sets of spaced, oppositely disposed lead wires that extend toward said body and respectively through said open end walls.

3. The package of claim 2 wherein said lead wires terminate in confronting spaced positions within the area defined by the periphery of said aperture in said top wall of said body.

4. The package of claim 3 wherein said lead wires of said lead frame are movable one relative to the other to permit respective insertion of said sets of lead wires into said open end walls.

5. The package of claim 1 wherein said cooperating means are first means formed on said body and second means formed on said lead frame with said first and second means being engaged to position said body in predetermined relationship with respect to said lead frame.

6. The package of claim 5 wherein said first means are at least one notch formed in each sidewall of said body and said second means are mating projections extending from said lead frame, said notches and projections being respectively engaged for positioning said body in all three coordinate directions with respect to said lead frame.

7. The package of claim 5 wherein said first means are a groove formed in each sidewall of said body, and said second means are elongated mating projections extending from said lead frame, said grooves and projections being respectively engaged for positioning said body in all three coordinate directions with respect to said lead frame.

8. The package of claim 1 wherein said header body forms a closed loop that includes said top and bottom walls, said pair of sidewalls and said pair of end walls.

9. The package of claim 8 wherein said closed loop body is a continuous tube with the top wall flattened around said aperture and the bottom wall flattened below said aperture.

10. The package of claim 1 wherein (a) said top wall has more than one aperture formed therein; and wherein (b) each of said end walls is at least partially open; and wherein (c) said lead frame has two sets of leads extending from each of two opposite sides toward and respectively through said open end walls; and wherein (d) one set of leads from each of said opposite sides of said lead frame generally extend toward the area defined by the periphery of one of said apertures in said top wall; and wherein (e) another set of leads from each of said opposite sides of said lead frame generally extend toward the area defined by the periphery of the other of said apertures in said top wall.

11. The package of claim 2 and further including a glass seal formed between said body and said leads of said lead frame so as to firmly hold said leads in a predetermined spaced relationship with respect to said open end walls.

12. The package of claim 11 wherein an electrical device is secured within said body, and wherein leads from said electrical device being selectively connected to said leads of said lead frame.

13. The package of claim 12 wherein a cover is secured to said top wall of said body overlying said aperture hermetically sealing said package.

14. A hermetically sealed package for an electrical device of the type having a plurality of lead wires extending from the package comprising:

(a) a header body having top and bottom walls, a pair of sidewalls and at least a pair of end walls, with said top wall having at least two apertures formed therein, and with said end walls being at least partially open; and (b) a plurality of lead wires extending from each of said open end walls; wherein (c) one set of said lead wires respectively extend from the areas defined by the periphery of said apertures in said top wall through one of said open end walls; and wherein (d) another set of said lead wires respectively extend from the areas defined by the periphery of said apertures in said top wall through the other of said open end walls; and wherein (e) a glass seal is formed between said body and said lead wires; and wherein (f) said body has means formed thereon for holding said body in a predetermined spaced relationship with respect to said lead wires during formation of said glass seal and fabrication of said hermetically sealed package.

15. A method of fabricating a package for hermetically sealing an electrical device of the type having at least one lead wire extending from the package, comprising the steps of:

(a) forming a closed loop header body having top and bottom walls, a pair of sidewalls and at least a pair of end walls with said top wall having an aperture formed therein and at least one of said end walls being at least partially open; and (b) forming a lead frame having at least one lead wire extending therefrom; and (c) forming on said header body and lead frame cooperating means for positioning said body with respect to said lead frame; and (d) inserting said lead wire of said lead frame into said open end wall of said body; and (e) engaging said cooperating means on said package so that said lead wire is positioned in a predetermined relationship with respect to said body.

16. The method defined in claim 15 wherein both of said end walls are at least partially open, and said lead frame has two sets of oppositely disposed, spaced lead wires extending therefrom, and wherein said sets of lead wires are respectively inserted into said open end walls of said body.

17. The method defined in claim 15 further including the step of forming a seal between said lead wire and said body.

18. The method defined in claim 17 wherein said seal is formed by placing a particulate glass slurry into said body so as to at least cover the space between said lead wire and said body and by fusing said glass particles into a solid glass mass.

19. The method defined in claim 17 further including the steps of removing selected portions of said lead frame and disengaging said cooperating means so that said seal supports and positions said lead wire in an electrically isolated position with respect to said body.

20. The method defined in claim 17 further including the steps of securing an electrical device within said body, and electrically connecting a lead from said device to said lead wire.

21. The method defined in claim 20 further including the step of securing a cover to the top wall of said body overlying said aperture so as to hermetically seal said package.

References Cited

UNITED STATES PATENTS

| | | | |
|---|---|---|---|
| 2,057,266 | 10/1936 | Rippere | 174—133 XR |
| 2,615,857 | 10/1952 | Clarke. | |
| 3,320,351 | 5/1967 | Glickman. | |
| 3,340,348 | 9/1967 | Clark et al. | |
| 3,351,701 | 11/1967 | Wood. | |
| 3,281,628 | 10/1966 | Bauer et al. | |
| 3,317,287 | 5/1967 | Caracciolo. | |

DARRELL L. CLAY, Primary Examiner

U.S. Cl. X.R.

29—193, 193.5, 588, 589; 113—119; 174—50.61